(12) United States Patent
Joshi et al.

(10) Patent No.: US 7,948,542 B2
(45) Date of Patent: May 24, 2011

(54) FAST-SETTLING LINE DRIVER DESIGN FOR HIGH RESOLUTION VIDEO IR AND VISIBLE IMAGERS

(75) Inventors: Atul Joshi, Thousand Oaks, CA (US);
Hakan Durmus, Los Angeles, CA (US);
Vincent M. Douence, Thousand Oaks, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 991 days.

(21) Appl. No.: 11/825,367

(22) Filed: Jul. 5, 2007

(65) Prior Publication Data
US 2009/0009642 A1    Jan. 8, 2009

(51) Int. Cl.
*H04N 3/14* (2006.01)
*H04N 5/335* (2006.01)

(52) U.S. Cl. .................... 348/301; 348/300; 348/308

(58) Field of Classification Search .............. 348/300, 348/301, 303, 304, 305, 317, 319, 320
See application file for complete search history.

(56) References Cited

U.S. PATENT DOCUMENTS

| | | | | |
|---|---|---|---|---|
| 5,963,156 | A * | 10/1999 | Lewicki et al. | 341/122 |
| 6,049,246 | A | 4/2000 | Kozisek et al. | 330/9 |
| 6,603,511 | B1 | 8/2003 | Ishida | 348/294 |
| 6,606,121 | B1 | 8/2003 | Bohm et al. | 348/297 |
| 6,831,689 | B2 | 12/2004 | Yadid-Pecht | 348/297 |
| 6,864,920 | B1 | 3/2005 | Kindt et al. | 348/308 |
| 7,221,396 | B2 | 5/2007 | Lenz | 348/297 |
| 7,382,407 | B2 | 6/2008 | Cho et al. | 348/296 |
| 2005/0088554 | A1* | 4/2005 | Scott-Thomas et al. | 348/294 |
| 2008/0024630 | A1* | 1/2008 | Hiyama et al. | 348/241 |
| 2008/0074521 | A1* | 3/2008 | Olsen | 348/300 |
| 2008/0316335 | A1* | 12/2008 | Rossi | 348/231.99 |

* cited by examiner

*Primary Examiner* — Sinh Tran
*Assistant Examiner* — Selam Gebriel
(74) *Attorney, Agent, or Firm* — Koppel, Patrick, Heybl & Philpott

(57) ABSTRACT

A fast-settling line driver circuit capable of high-speed operation. The line driver is particularly well-suited for operation in a high-resolution imaging system. The line driver circuit comprises a signal amplifier that is configured in a negative feedback loop and connected to a bus line through a switch network. The switch network is disposed inside the feedback loop while the line driver is transmitting a signal onto the bus line. This configuration reduces the settling time of the line driver by substantially eliminating the effect of the switch resistance on the RC time constant. The line driver also comprises offset cancellation and presettle circuits that improve the integrity of the output signal and reduce the power consumption of the system.

17 Claims, 5 Drawing Sheets

FAST-SETTLING LINE DRIVER DESIGN FOR HIGH RESOLUTION VIDEO IR AND VISIBLE IMAGERS

BACKGROUND OF THE INVENTION

1. Field of the Invention

The invention relates to line driver circuits and, more particularly, to imaging devices having a fast-settling line driver for efficient high-resolution operation.

2. Description of the Related Art

Imaging systems, especially those in the visible and infrared bands, have many modern applications in various fields including personal digital photography, astronomy, medical imagery, surveillance, security and military target acquisition. Such systems are based on image sensors that convert light into an electrical signal. Light sensing visible imager sensors have become increasingly popular in recent years, especially in digital still cameras and video camcorders. Their popularity has been fueled by the development and availability of new cost-effective image sensor technologies.

Charge-coupled devices (CCD) and complimentary metal-oxide semiconductor (CMOS) are two widely used technologies for fabricating image sensors.

CCDs are an integrated circuit with an array of light-sensitive capacitors that are linked or coupled together. CCD signals require special off-chip processing, which increases the cost of a CCD imaging system.

CMOS image sensors are devices that use complimentary and symmetrical pairs of n-type and p-type field-effect transistors to perform basic logic functions. CMOS technology is used to create microprocessors, microcontrollers, static memory, data converters, amplifiers and other digital and analog circuits. One type of image sensor that can be made using normal CMOS processes is an active pixel sensor (APS). APS imagers include an array of pixels each of which comprise a photodiode to collect the input signal and multiple transistors to buffer and amplify the signal for output.

Although CCD devices currently offer a superior dynamic range, CMOS devices are more cost-effective because they use standard semiconductor processes and offer higher levels of integration on a single chip. Due to advantages of CMOS image sensors, they are more desirable for consumer products.

As the market demand for high resolution imaging products continues to increase, so do efforts to maximize the number of pixels that can be built onto a small chip area. The pixels require some circuitry for transducing and transmitting a signal to other components for processing. This circuitry includes transistors for amplifying and switching signals for line transmission. Typically the signals travel along a wire called a bus to the signal processing components.

One component that is of particular interest to circuit designers is the line driver. A line driver is an amplifier circuit that is used to improve the reliability of a transmission line by driving the input from the pixels onto the line, often called a bus, where they are then sent to other components for processing. Substantial effort has been devoted to improving the quality of line driver circuits, especially in the field of video imaging. As the demand for high definition video increases, video imagers require faster line driver circuits to accommodate large arrays of pixels (e.g., 1920×1080) with a typical 30 Hz or 60 Hz frame rate. Faster line drivers tend to dissipate large amounts of power and can drain portable power sources such as batteries quickly.

A known line driver circuit 100 is shown in FIG. 1. The input signal Vin is connected to the positive terminal of amplifier 102. The output of the amplifier is fed back into the negative input terminal of the amplifier, creating a negative feedback loop that stabilizes the amplifier 102. The output of the amplifier 102 is connected to a bus line 104 through switch 106. The operation of line drivers is discussed in more detail below.

One approach that has been taken to reduce power consumption is to use multiple buses to send data from the pixels to the processing circuitry. A multiple bus architecture allows the pixel signals to be transmitted in parallel, reducing the operating speed of the line drivers. For example, if a dual-bus configuration is used, each of the line drivers along the buses can operate at one half the speed that would be required in a single bus configuration. Although using multiple buses has been effective, it is not practical to simply add more buses to an imager. Buses take up valuable space on a chip, adding significant production costs. They also add complexity to the design thus increasing design verification cost.

As the number of pixels increases, the length of the buses and the number of switches per bus must also increase. One byproduct of longer buses and more switches is an increase in the settling time of the individual line drivers, meaning that the signal at the line driver takes longer to approach the target input voltage. This can be problematic if the line drivers must accommodate a high bit resolution such as 12 bits where the difference between the value the line drive outputs in the given time period and the value it would eventually settle to if a much larger amount of time was available (i.e., the target voltage) must be small when the signal is transmitted onto the bus.

FIG. 2 depicts a model circuit 200 that is electrically analogous to the line driver circuit 100. In circuit 200, $g_m$ is the transconductance of the amplifier 102, $R_{SW}$ is the resistance of the switch 106, $R_{LINE}$ is the series resistance of the bus line 104 and $C_{LINE}$ is the capacitance of the bus line 104 (which includes the capacitance of the switches connected to the line). $V_{OUT}$ is the output voltage that is delivered to the bus line 104. The settling time of a circuit is proportional to the RC time constant ($\tau$), a well-known parameter of resistive and capacitive circuits. For 10-bit settling, the settling time is 6.9×$\tau$. While for 12-bit settling the settling time is 8.4×$\tau$. Referring to circuit 200, the RC time constant may be calculated according to the following equation:

$$\tau = RC \approx \left(\frac{1}{g_m} + R_{SW} + R_{LINE}\right) C_{LINE}$$

Given the configuration of line driver circuit 100, the resistance of the switch $R_{SW}$ usually dominates the time constant, and thus the settling time. One reason for $R_{SW}$ limiting $\tau$ is that, unlike other parameters, $R_{SW}$ cannot be independently reduced. To reduce $R_{SW}$ the switch needs to be made wider which increases $C_{LINE}$.

Several solutions have been used to reduce the settling time of line drivers in high resolution imagers. As mentioned above, the settling time of typical line drivers in these large arrays, is determined mostly by the resistance of the switch 106 (FIG. 1) connecting the amplifier to the bus. The settling time may be decreased by using a larger switch that has less resistance; however, the larger switch also increases the load and the capacitance on the bus. Another solution is to increase the power of the line driver. This method is also insufficient because the adjustment only has a sub-linear effect (i.e., it only affects that $g_m$ term) as the switch resistance eventually dominates, keeping the settling time large.

Thus, there is a need for a fast-settling line driver that is capable of operating in high resolution imaging systems.

SUMMARY OF THE INVENTION

The present invention as embodied in the claims discloses a new line driver device. One embodiment of a line driver comprises a signal amplifier having output terminal. The signal amplifier is connected in a negative feedback loop to receive an input signal. A presettle circuit is connected to the signal amplifier output. An offset cancellation circuit is connected to the signal amplifier output. A bus connection network is connected to the signal amplifier output terminal. The bus connection network is inside the negative feedback loop when the signal amplifier is transmitting the output signal.

One embodiment of an imaging system according to the claims of the present invention comprises an array of pixels having rows and columns. The array is connected to transduce incident radiation into an electrical output signal. A vertical scanner is connected to communicate with the rows of pixels. A horizontal scanner is connected to communicate with the columns of pixels. A column buffer is connected to process and temporarily store signals from the columns of pixels. The column buffer comprises a plurality of column amplifiers with each of the columns of pixels associated with a corresponding one of the column amplifiers. The column buffer further comprises a plurality of line drivers, each of the line drivers connected between the output of at least one of the column amplifiers and a bus line to transmit signals from the column amplifier onto the bus line. Each of the line drivers is configured in a negative feedback loop and has a bus switch arranged within the feedback loop such that the settling time of the line driver is less than the settling time of a similar line driver having a bus switch outside the feedback loop. A control circuit is connected to manage the operation of the column buffer.

One embodiment of a method for reducing the settling time of a line driver circuit comprises buffering an input signal to produce an output signal using an amplifier configured in a negative feedback loop. The amplifier is allowed to presettle before transmitting the output signal onto a bus line. The amplifier is connected to the bus line through a switch that is disposed within the negative feedback loop. The amplifier is disconnected from the bus line after the output signal is transmitted.

Another embodiment of an imaging system according to the claims of the present invention comprises an array of pixels connected to transduce incident radiation into an electrical output signal. A first scanner is connected to communicate with the groups of pixels according to a first spatial dimension. A second scanner is connected to communicate with groups of the pixels according to a second spatial dimension. A pixel buffer is connected to process and temporarily store signals from the array of pixels. The pixel buffer comprises a plurality of pixel amplifiers. Each of the groups of pixels according to the first spatial dimension is associated with a corresponding one of the pixel amplifiers. The pixel buffer also comprises a plurality of line drivers. Each of the line drivers is connected between the output of at least one of the pixel amplifiers and a bus line to transmit signals from the pixel amplifier onto the bus line. Each of the line drivers is configured in a negative feedback loop and has a bus switch arranged within the feedback loop such that the settling time of the line driver is less than the settling time of a similar line driver having a bus switch outside a feedback loop. A control circuit is connected to manage the operation of the pixel buffer.

These and other aspects and advantages of the invention will become apparent from the following detailed description and the accompanying drawings which illustrate by way of example the features of the invention.

DETAILED DESCRIPTION OF THE INVENTION

Figure 1:
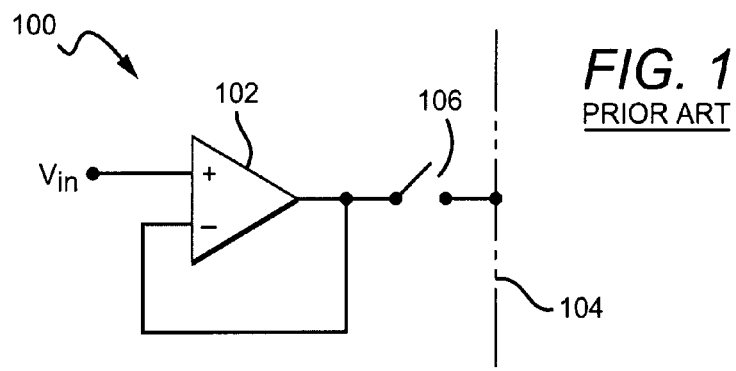
FIG. 1 is a schematic view of a known line driver circuit.
Figure 2:
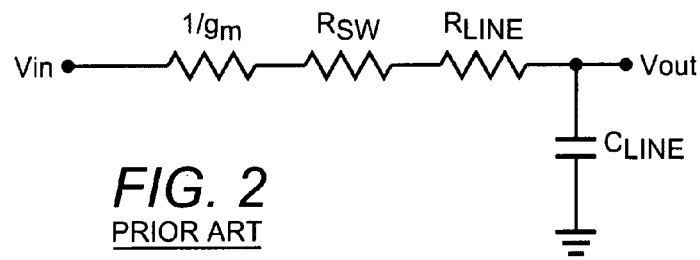
FIG. 2 is a circuit schematic modeling a known line driver circuit.

The present invention provides an improved line driver circuit and, more generally, an imaging system that incorporates the line driver. The new line driver circuit is particularly well-suited for use in an imaging system designed for high-resolution (i.e. more pixels) operation at video frame rates. Although the line driver is described in detail with respect to a preferred embodiment as a component of a high-resolution imaging system, it is understood that the new line driver can be used in a variety of systems to drive electrical signals onto a transmission or bus line. The operation of the line driver is described herein with reference to an exemplary system in which the line driver can function (i.e., an imaging system); however, the line driver should not be limited to operation in any particular application or system.

Referring now to an imaging system, all of the components needed to produce an image signal are located on a single chip, eliminating the need for off-chip processing and reducing associated degradation of performance and decreasing cost. The input component of the imaging system comprises an array of sensors that detect radiation within a certain bandwidth, such as the visible spectrum or the infrared spectrum. These sensors, called pixels, can comprise photodiodes, for example. As the pixels within the array are exposed to an incident input signal (e.g., light from an image), they sequentially output a voltage signal that carries information about the intensity of the input signal at each pixel.

Pixel arrays may be linear, rectangular, circular or another shape. Pixels can be located and accessed using a two-dimensional coordinate system. For example, if the array is rectangular the pixels may be arranged in columns and rows with individual pixels identifiable by a column position and a row position (e.g., a conventional x-y coordinate system.) An array may also be arranged in a circular pattern with concentric rings of pixels around a center point. In this exemplary configuration, an individual pixel can be located using a referenced angular coordinate and a radial coordinate (e.g., a conventional polar coordinate system.) A preferred embodiment includes a rectangular array which is used herein to describe the operation of an imaging system including the new line driver in more detail.

The resolution of any imaging system is limited by the number of pixel signals that can be processed during a single frame of a video image. Most imaging systems operate with a 30 Hz or 60 Hz frame rate, meaning that 30 frames or 60 frames have to be processed in one second. For example, high definition television (HDTV) requires a pixel array with dimensions of 1920×1080, totaling more than 2 million pixels. Assuming a 30 Hz frame rate, an HDTV system would be required to process more than 62,000,000 pixel signals per second. Thus, it is paramount that the back-end system components operate reliably at high speeds. One such component is the line driver circuit which functions to drive signals from each column of pixels to a bus line where they can be transmitted for processing and output.

The present invention as embodied in the claims improves the system speed by reducing the settling time of the line driver circuits. This is achieved by configuring the bus switch (the switch that connects the line driver to the bus line) within the circuit such that the switch resistance does not substantially affect the settling time, as discussed in detail below.

Another advantage of the present invention as embodied in the claims is the cancellation of offset currents generated by the many signal amplifiers in the line driver circuits. This helps to eliminate column pattern noise resulting from the different internal offset voltages of the signal amplifiers associated with each column of pixels. An offset cancellation circuit captures the offset current from the signal amplifier and generates an offset cancellation current that is substantially equal in magnitude to the offset current but that flows in the opposite direction. Thus, the two equal but opposite currents cancel each other out, and as a result column pattern noise is significantly reduced.

Figure 3:
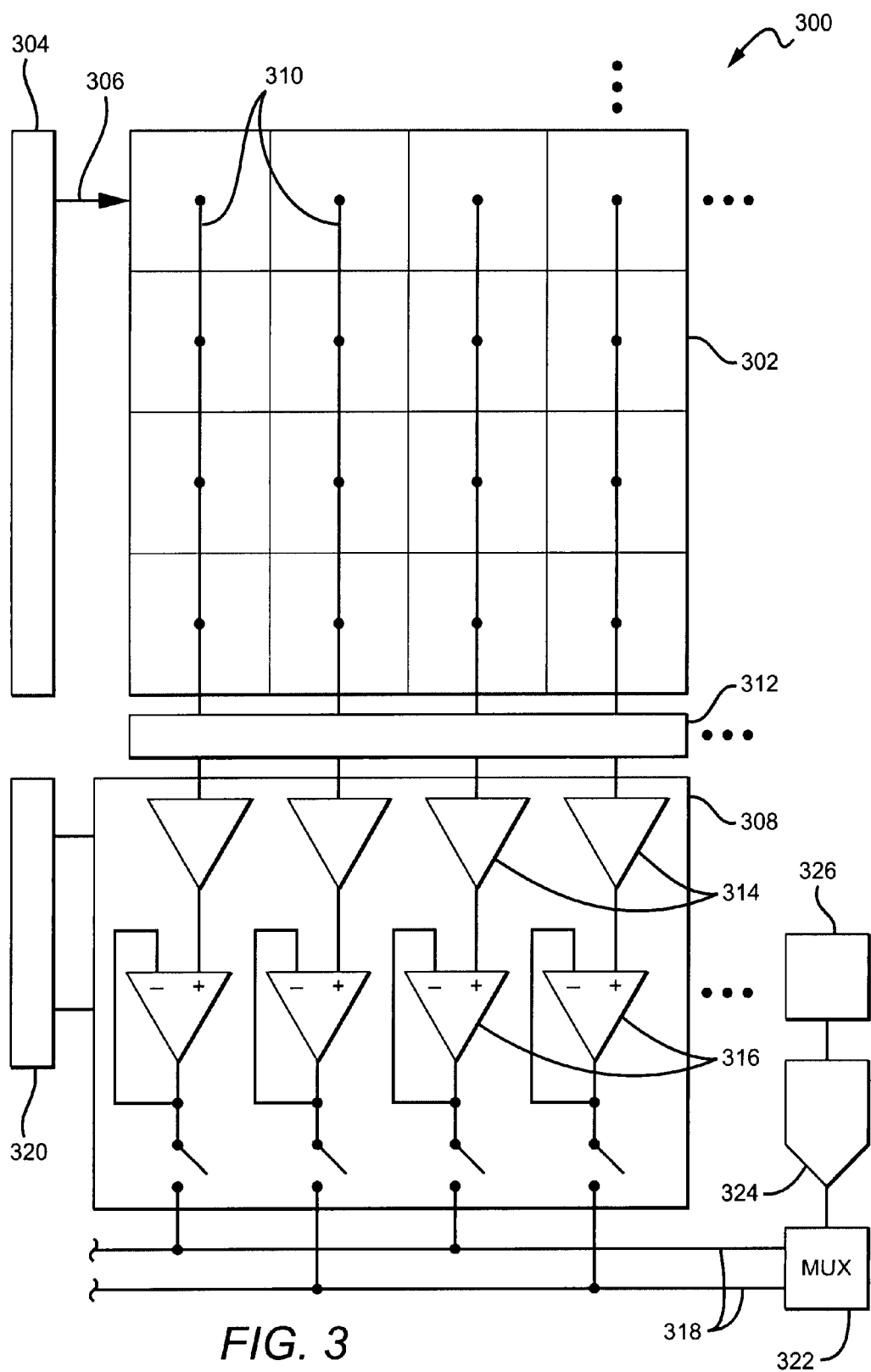
FIG. 3 is a schematic view of an embodiment of an imaging system according to the present invention.

FIG. 3 depicts a block diagram of one embodiment of a high-resolution imaging system 300 according to the present invention. An input signal, such as the light from an image, is directed onto an array of pixels 302. A 4×4 array is shown in FIG. 3; however, it is understood that the array may contain many more rows and columns in various aspect ratios. Individual pixels comprise sensors, such as photodiodes, capable of detecting radiation within a certain bandwidth. Other sensors that detect radiation outside the visible spectrum may also be used, depending on the nature of the input. Passive pixels connect the sensor to the column bus through a switch. Active pixels have additional circuitry that buffers the sensor signal. Source follower amplifier, capacitive trans-impedance amplifier (CTIA) and resistive trans-impedance amplifier (RTIA) are a few examples of such circuitry. The incident input signal creates a current flow that is usually integrated into a voltage signal that is related to the flux in each of the pixels. These voltage values can be measured and transmitted as an output signal.

Because the exemplary array that is explained in detail is rectangular, various components are described according to that configuration. For example, vertical and horizontal scanners refer to scanners that communicate with pixels along those two planar dimensions. Other components such as the column buffer and column amplifier also imply an association to a rectangular pixel array. The nomenclature of these components is meant to provide additional descriptive aid with reference to a preferred embodiment having a rectangular pixel configuration. However, the nomenclature should not limit the components to any particular embodiment. For example, in a non-rectangular array the column buffer element might be called a pixel buffer. Thus, it is understood that these components can function in a similar fashion in other systems that use non-rectangular arrays.

The vertical scanner 304 is connected to the pixel array 302. Horizontal buses (not shown) provide an electrical path for vertical scanner 304 signals to control the timing of the pixel circuitry in each row. Vertical scanner 304 comprises electrical pointers, such as pointer 306 to activate rows of pixels for evaluation and read out processes. For example, pointer 306 may function as an evaluation read pointer that performs an initial evaluation read on each row of pixels so that the status of the pixels in a particular row may be evaluated. The pointer 306 might also function as row read pointer that activates the row of pixels, enabling the pixel data to be read into a column buffer 308. Although only one pointer 306 is shown, the vertical scanner 304 can comprise multiple pointers each of which performs a different function. After pointer 306 finishes processing one row, it moves to the next row and repeats its functional sequence.

The column buffer 308 is connected to the pixel array 302 via a series of buses 310 running along each column of pixels in the array 302. Each column can be connected to the column buffer with one or multiple column buses. For example, in one embodiment the imaging system may use one column bus for a preliminary read to evaluate the status of a pixel and another column bus for transmitting final pixel output signal. The pointer 306 activates a pixel in each column to put its signal on column bus 310 so that the information may be delivered from the pixels in that column to the column buffer 308 for temporary storage before the data is output for processing. The horizontal scanner 312 is connected to the column buffer 308. The horizontal scanner comprises one or more digital column read pointers, which are used to address the appropriate column cell to read out the signal from the column buffer 308. Known timing and control circuits (not shown) can be used to synchronize the operation of the vertical scanner 304, the horizontal scanner 312 and the column buffer 308. A known bias generator circuit (not shown) can be used to bias the various components of the system 300.

Column buffer 308 comprises two different memory locations where the signals from the pixels can be processed and stored temporarily until the system is ready to output them. Each column of pixels has an associated column amplifier 314. Signals from the pixels can be amplified at the column amplifier 314 and are eventually sent to the line drivers 316. Each column amplifier 314 may correspond to a unique line driver 316 as shown in FIG. 3. In another embodiment discussed in more detail below, multiple column amplifiers can correspond to a single line driver. After the signals are passed from the column amplifier, they are then stored and processed in the line driver 316 until they are transmitted onto the line buses 318.

The column amplifiers 314 and the line drivers 316 cooperate in a dual-stage amplification architecture within the column buffer 308. The column amplifiers 314 can be programmable in order to provide a range of gains to the signals. In some cases, it may be advantageous to gain up the pixel signals. For example, a dark scene may yield very low signals from the pixels in the array 302. These low level signals can be gained up in the column amplifiers 314 prior to entering the line drivers 316.

Pre-amplification in the column amplifiers 314 provides that the line drivers 316 can operate as a buffer at unity gain. This is beneficial because the line drivers 316 are required to operate at speeds much faster than the column amplifiers 314, limiting their ability to provide gain. Considering modern resolution and frame rate specifications, a typical operating speed for a column amplifier would be tens of kHz with a typical operating speed of tens of MHz for a line driver. According to the gain-bandwidth product, as the gain of an amplifier increases, its maximum operating speed decreases proportionally. The dual-stage amplification architecture allows the column amplifiers 314 to gain up the pixel signals in the first stage at a slower speed, while the line drivers 316 buffer and drive the signals onto the bus line 318 at higher speeds in the latter stage.

A control circuit 320 controls the operation of the column amplifiers 314 and the line drivers 316. When activated by the horizontal scanner 312, signals from a row within the pixel array 302 are sent in parallel to the column amplifiers 314 associated with each column. The control circuit 320 passes the signals on to the line drivers 316 where they remain until transmitted to the bus lines 318, during which time the signals from the next row of pixels are being sent to the column amplifiers 314. Thus, as mentioned above, there are two sequential memory locations within the column buffer 308 where the signals are temporarily stored.

The line buses 318 carry the signals from the line drivers 316 to be processed for output. In this particular embodiment the imaging system 300 utilizes two parallel bus lines 318. It is understood that more than two bus lines may be used, or a single bus line may be used. If more than one bus line is used the signals can be recombined using a multiplexer (mux) 322 as shown in FIG. 3. A mux is a known device that can accept multiple input signals and serialize them into a single output signal. The output signal can then be converted from an analog signal into the digital regime using an analog-to-digital converter (ADC) 324. The signal may undergo additional processing before it is sent to the output device 326. The output device 326 can be, for example, a television screen or an electronic file.

Alternatively, the signal may be fed into a video amplifier (not shown) instead of an ADC. A video amplifier can be used, for example, if the design requires an off-chip ADC or if the device being driven is an analog device.

Figure 4A:
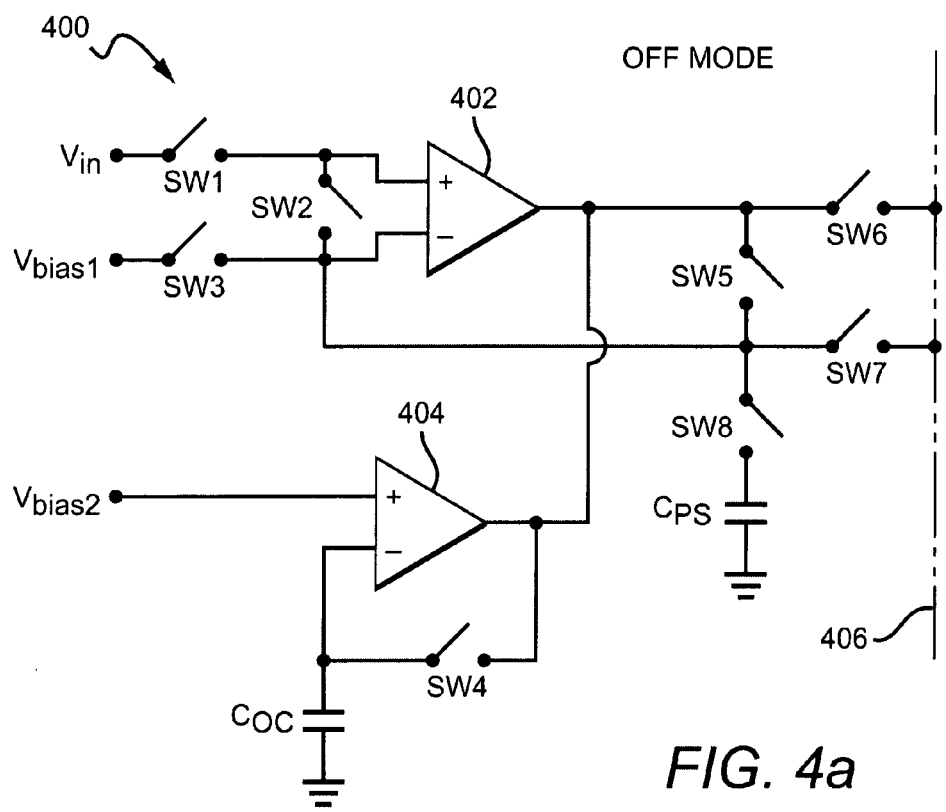
FIGS. 4a-4d are schematic views of one embodiment of a line driver circuit according to the present invention, showing the various configurations of the circuit during five different modes of operation.

FIG. 4a is a schematic representation of an embodiment of a line driver 400 according to the present invention. The output from the column amplifiers 314 is passed to each line driver 400 as signal $V_{in}$. A signal amplifier 402 accepts $V_{in}$ at the positive terminal. The signal amplifier 402 is configured in a negative feedback loop, although the loop path varies according to the mode in which the line driver 400 is operating. The line driver operates in five modes, OFF MODE (OM), WAKE-UP MODE (WUM), OFFSET CANCELLATION MODE (OCM), PRESETTLE MODE (PSM) and DRIVE MODE (DM), each of which are discussed in detail below.

The line driver 400 comprises eight switches SW1-SW8. These switches are opened and closed in various combinations, determining the mode of operation. Capacitor $C_{PS}$ is operable during PSM. $C_{OC}$ and offset amplifier 404 are used during the OCM. Signals are transmitted from the signal amplifier 402 to the bus line 406 when the line driver 400 is operating in DM. The line bus 406 carries the signals to be processed for output.

OFF MODE

At any given time during the operation of the imaging system, most of the line driver circuits are dormant. This is because signals can only be transmitted from a line driver to a single line bus one at a time. Multiple bus lines allow for simultaneous parallel transfer. For example, if the system uses four line buses, then the four line drivers can deliver a signal to each of the lines at the same time. Assuming an HDTV pixel array and a four-bus line configuration, for example, 1916 of the line drivers are not transmitting signals to a bus line, compared to four that are. The switches that are not transferring signals are waiting to be activated in the OM. The switches in the OM load the bus with their capacitance and affect the time constant.

FIG. 4a depicts an embodiment of a line driver according to the present invention that is in the OM. All of the switches SW1-SW8 are open. Switches SW1-SW8 are preferably field effect transistors (FETs), although other switching mechanisms may be used. Because SW1 is open, there is no signal present at the input of the signal amplifier 402 to be amplified. The signal from the pixel is temporarily stored in the column amplifier 314 until the line driver 400 is made accessible to the signal by closing SW1. Holding the line driver 400 in OM when it is not necessary to transmit a signal conserves power and improves the operable lifetime of the system if the system is powered by a portable power source, e.g., batteries.

WAKE-UP MODE

Figure 4B:
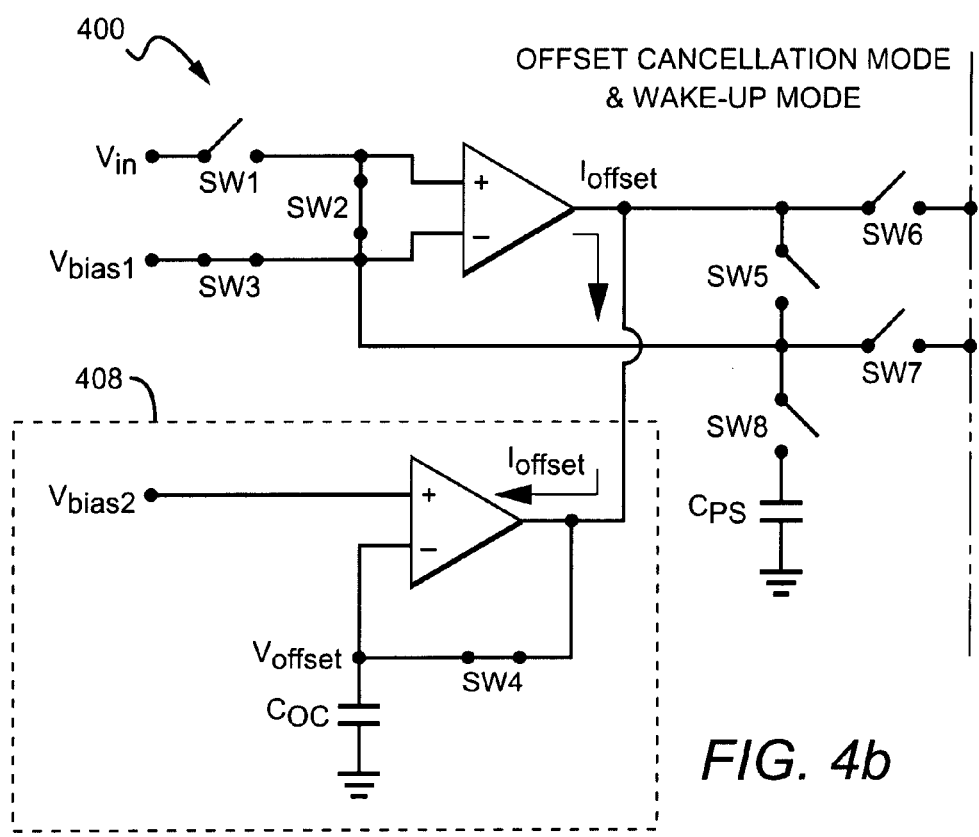

FIG. 4b illustrates an embodiment of a line driver circuit 400 according to the present invention operating in WAKE-UP MODE (WUM). The switch configuration during WUM can be the same as the configuration during OCM. When the line driver transitions to WUM, the amplifiers 402, 404 are powered up prior to operation. This allows the internal amplifier elements to generate the necessary node voltages and currents to bring the amplifiers 402, 404 to the quiescent state for normal operation.

OFFSET CANCELLATION MODE

FIG. 4b also illustrates an embodiment of a line driver circuit 400 according to the present invention that is operating in OCM. The signal amplifier 402 is a typical differential amplifier configured in a negative feedback loop. This type of amplifier is widely used in electronics and known in the art. An ideal differential amplifier would provide a zeroed output voltage in response to a differential voltage of zero at the inputs (i.e., the voltage at the positive and negative inputs is the same). However, due to internal component mismatch and other imperfections there is typically an input voltage offset inherent to most differential amplifiers when used in a feedback configuration.

Each line driver 400 has a unique signal amplifier 402 and, by extension, a unique voltage offset associated with it. This becomes problematic in sensitive high-resolution imaging systems, because the voltage offset creates output signals that vary from column to column even for an identical input value, creating what is known in the art as column pattern noise, which is a form of fixed pattern noise (FPN). In order to reduce column pattern noise the voltage offset in each line driver must be substantially eliminated. There are many approaches to compensating for voltage offset, several of which are discussed in U.S. Pat. No. 6,049,246 to J. Kozisek, et al.

In this particular embodiment, offset cancellation circuit 408 is used to compensate for the voltage offset in the signal amplifier 402. Switches SW2, SW3 and SW4 are closed to initiate the OCM; all other switches remain open. An offset bias network comprises switches SW2 and SW3 and a reference voltage source. Other configurations of this network may also be used. In this configuration, the two inputs of the signal amplifier 402 are biased with a common reference voltage $V_{bias1}$. With the two inputs common, the signal amplifier 402 generates an offset current $I_{offset}$ that is proportional to the voltage offset. $I_{offset}$ flows into the output node of the offset amplifier 404, generating a proportional voltage at the negative input. This voltage is captured and stored at offset capacitor $C_{OC}$ throughout the operation of the line driver. During the rest of the modes, due to the voltage stored on $C_{OC}$, $I_{offset}$ flows out of the offset amplifier, canceling the offset from the signal amplifier.

PRESETTLE MODE

Figure 4C:
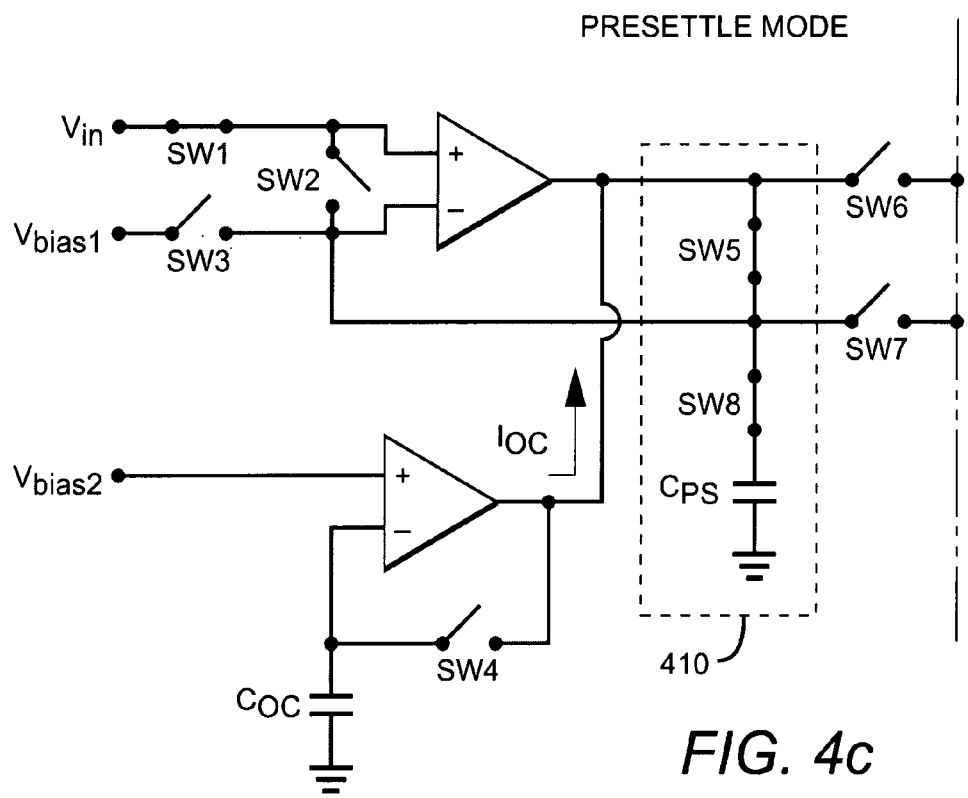

FIG. 4c shows an embodiment of a line driver 400 according to the present invention that is operating in the PRESETTLE MODE (PSM). In PSM the internal capacitance $C_{PS}$ is charged to the desired output value. There are two main advantages using this mode. Firstly, PSM puts the amplifier in a known and ready state. In this state the internal nodes of the amplifier are settled to the correct values and do not take up valuable settling time during the DM. Secondly, the capacitance $C_{PS}$ upon connection to the bus (at the beginning of the DM) provides some of the initial large current requirement of charge sharing between the bus and the amplifier's output to slew the bus closer to its final desired value. This helps decrease the slewing time of the amplifier. $C_{PS}$ is disconnected after some time, so that it does not slow down the amplifier settling time during DM. The PSM is initiated by closing switches SW1, SW5 and SW8; all other switches are open. When switch SW1 is closed, the signal from the column amplifier 314 is connected to the positive input of the signal amplifier 402, which is configured in a negative feedback loop through switch SW5. The signal amplifier 402 output begins approaching the target output voltage across the presettle capacitor $C_{PS}$. This allows the signal amplifier 402 to presettle before it is connected to the bus line 406, resulting in a faster overall settling time once the line driver 400 transitions to the DM as discussed above.

The voltage that was stored in $C_{OC}$, during the OCM, contains the offset information and from it, the offset amplifier provides the same current $I_{OC}$ which flows into the output node of the signal amplifier 402 and cancels out the offset current. Thus, the offset current is substantially eliminated from the current flowing through the feedback loop. The value of $C_{OC}$ should be selected such that the stored voltage does not discharge significantly during the readout time. Also, the KTC noise and charge injection on the $C_{OC}$ should not cause a significant offset over the duration of the PSM and the subsequent DM. This ensures that the offset current is substantially eliminated from the output signal for the entirety of the transmission.

DRIVE MODE

Figure 4D:
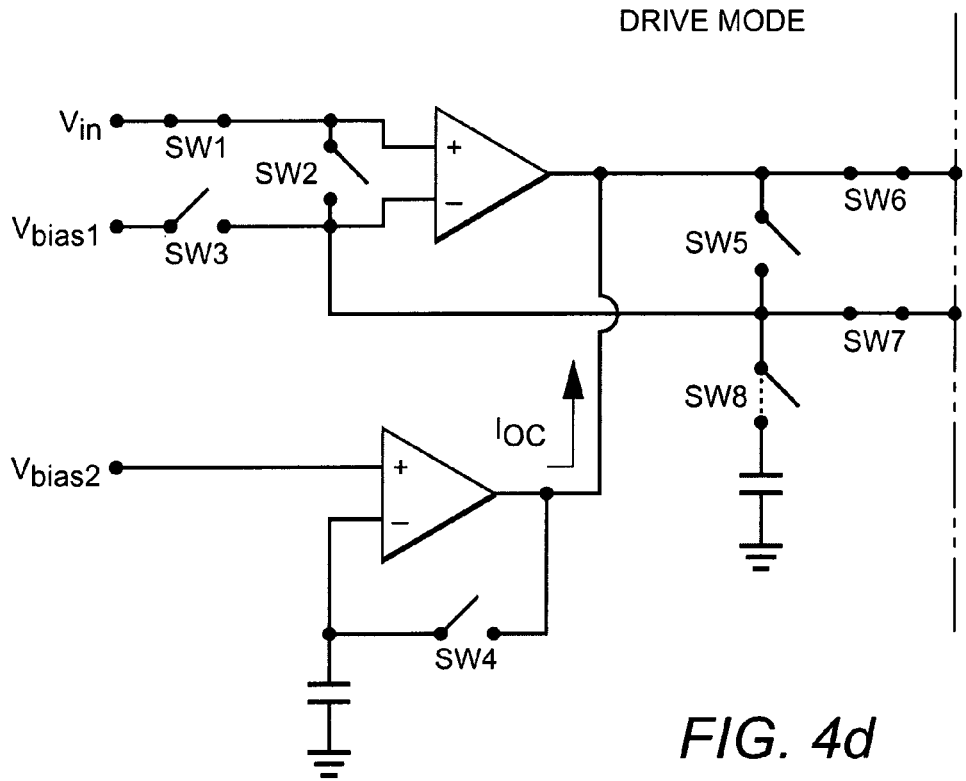

FIG. 4d shows an embodiment of a line driver 400 according to the present invention operating in DRIVE MODE (DM). During DM switches SW1, SW6 and SW7 are closed; all other switches are open. In addition, switch SW8 is initially closed (as denoted by the hashed connection) but is opened soon after entering the DM. Having already presettled, signal amplifier 402 begins driving the output signal onto the bus line 406. As soon as the switches SW6 and SW7 are closed the output signal on the bus line 406 begins moving towards the target output voltage (i.e., the output voltage from the signal amplifier just prior to initiation of DM.)

As mentioned above, switches SW6 and SW7 preferably comprise FETs. The drain terminals of these two FETs can be common, allowing for a single connection to the bus line 406. Because there is only one connection to the bus line 406 rather than two, the common drain configuration reduces the capacitance on the bus line 406.

Figure 5:
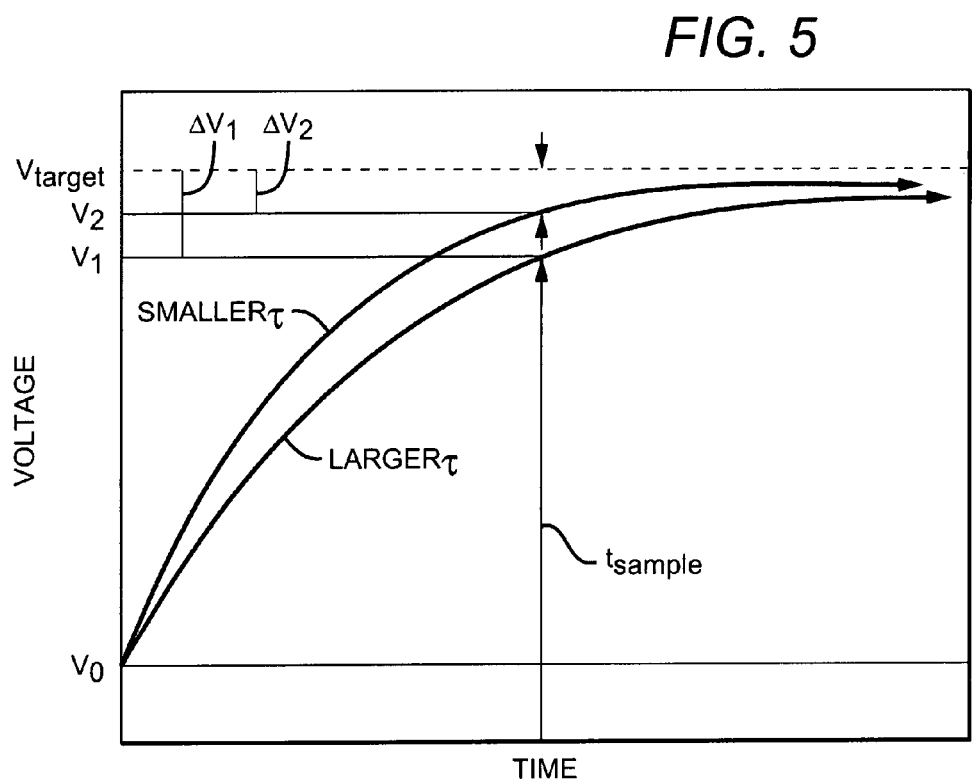
FIG. 5 is a graph modeling the signal response of a typical line driver circuit under different conditions.

The speed with which the output on the bus line 406 approaches the target output voltage is determined by the RC time constant ($\tau$). The settling time is proportional to $\tau$, as explained above. With reference to FIG. 5, if $\tau$ is large then it takes longer to reach a voltage level that is an acceptable representation of the target voltage ($V_{target}$). The difference between the output voltage on the bus line and the target output voltage ($\Delta V$) at the sample time $t_{sample}$ must be sufficiently small to achieve a desired resolution. That is, the signal on the bus line 406 must get close enough to the target voltage during one clock cycle of the horizontal scanner to describe a particular input value. In FIG. 5, $\Delta V_1$ corresponds to a larger value for $\tau$; $\Delta V_2$ results from a smaller value for $\tau$. $\Delta V_2$ is a more accurate representation of the target voltage. For example, for a 12-bit resolution there are 4096 bits possible. To maintain a low error rate (i.e., small $\Delta V$), the system requires that the output signal approach the target value quickly. Thus, a 12-bit system must have a small value for $\tau$ for a fast settling time. The higher the desired resolution, the faster the system must settle for a given operating speed. As explained earlier a 12-bit system requires $8.4\tau$ to settle while a 10-bit system only requires $6.9\tau$ to settle to the desired accuracy.

As discussed above, during DM switches SW6 and SW7 are disposed inside the feedback loop. This configuration yields value for $\tau$ that is substantially unaffected by the resistance of the switches SW6 and SW7. The feedback configuration makes the resistance of the switch negligible (suppressed by the gain of the amplifier). Since the resistance is negligible, smaller switches can be used. Smaller switches on the bus lead to lower total capacitance on the bus. Thus, both the total resistance and total capacitance in the time constant equation are decreased, allowing faster operation. The settling time is kept small, providing high-resolution data throughput.

At the end of the horizontal scanner clock cycle, the output voltage on the bus line 406 is sampled and sent to processing components such as mux 322 and ADC 324. The signal may be sampled with a sample-and-hold type circuit (not shown). If the settling time is fast, the sampled signal will be sufficiently close to the target output voltage and no resolution information will be lost. As mentioned above, a video amplifier may be used instead of the ADC 324 if an analog output is desired.

After the signal is transferred to the bus line 406, the line driver transitions back into the OM to conserve power, and the next line driver in the sequence begins the process to transfer its signal to the bus line 420.

Figure 6:
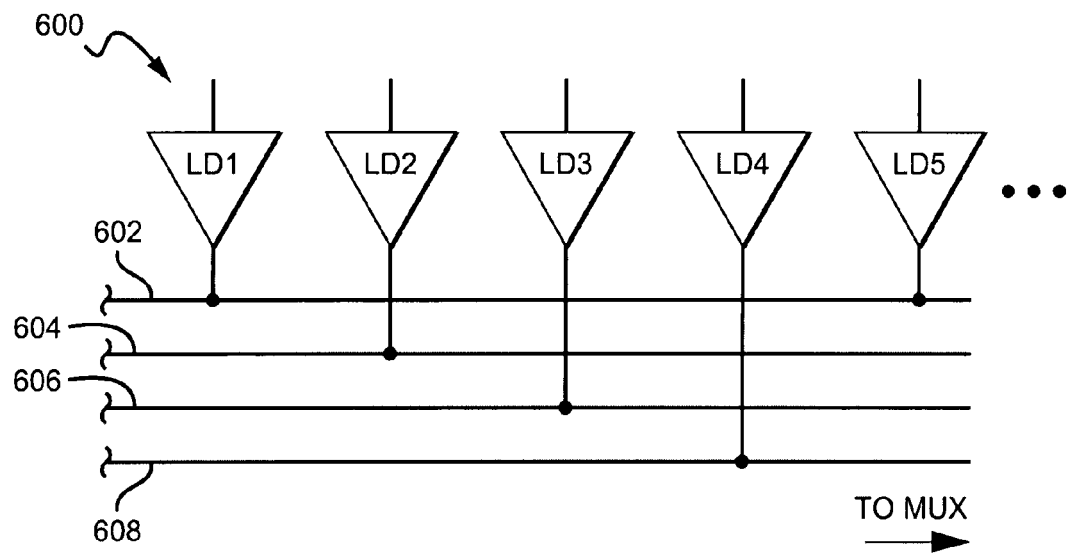
FIG. 6 is a schematic view of an embodiment of a column buffer component according to the present invention.

In one embodiment of an imaging system, multiple bus lines are used to transmit the signals from the line drivers to the processing circuitry. FIG. 6 depicts one such embodiment of an imaging system 600 according to the present invention. This particular system comprises four bus lines 602, 604, 606, 608. Each bus line is connected to a plurality of line drivers. Line driver LD1 transfers a signal onto bus line 602 for transmission to processing components such as an ADC or a video amplifier. At the same time line drivers LD2, LD3 and LD4 can be transmitting signals to their respective bus lines 604, 606 and 608. After LD1 has completed its transmission, then line driver LD5 can begin to transmit its signal onto bus line 602. The multiple signals from the bus lines can be recombined into a single serial signal with a mux element (not shown). Although the line drivers are shown connected in a particular sequence, other sequences are possible. Because the number of line drivers connected to each bus line is reduced, the multiple bus line configuration decreases the total amount of capacitance that is present on each of the bus lines.

Figure 7:
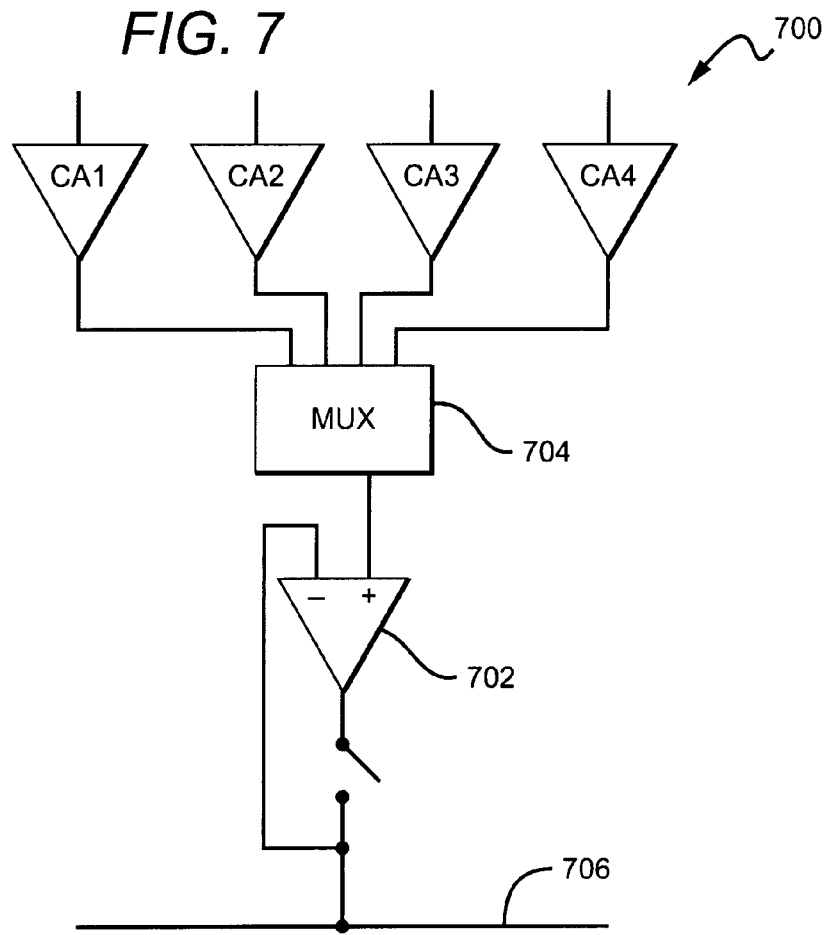
FIG. 7 is a schematic view of an embodiment of an imaging system having a multiple bus line configuration according to the present invention.

FIG. 7 illustrates a column buffer component 700 from another embodiment of an imaging system according to the present invention. In this particular configuration, multiple column amplifiers CA1-CA4 feed into a single line driver 702. Signals from the pixel columns are input to the associated column amplifiers CA1-CA4 where they are temporarily stored and amplified if necessary. The signals are then multiplexed at the mux element 704 into a single serial signal.

When line driver 702 transitions to DM, the signals are transmitted in a sequence onto the bus line.

Combining the column amplifiers CA1-CA4 with a single line driver 702 is advantageous for several reasons. Because the line driver 702 is required to operate at a much higher speed than the column amplifiers CA1-CA4, there is no delay in transmission resulting from the multiple column amplifier arrangement. As column amplifiers have much lower bandwidth than that of the line driver, the column buffer amplifier outputs are sampled onto a sample and hold capacitor (not shown here) so that they can be multiplexed onto the line driver at a fast rate. The configuration provides that a single line driver 702 can accommodate multiple columns within the pixel array. Thus, less line drivers are required, saving valuable space on the imager chip and reducing fabrication costs. The arrangement also conserves power by eliminating the number of line drivers that must be powered up prior to operation. The WUM and OCM can be performed once for multiple columns rather than once for each column. The PSM and DM must still be performed for each column that is connected to the line driver 702. Although, the preferred number of column amplifiers that can be connected to a single line driver is four, other configurations with fewer or more column amplifiers connected to one line driver are possible.

Although the present invention has been described in detail with reference to certain preferred configurations thereof, other versions are possible. Therefore, the spirit and scope of the invention should not be limited to the versions described above.

We claim:

1. An imaging system, comprising:
   an array of pixels having rows and columns, said array connected to transduce incident radiation into an electrical output signal;
   a vertical scanner connected to communicate with said rows of pixels;
   a horizontal scanner connected to communicate with said columns of pixels;
   a column buffer connected to process and temporarily store signals from said columns of pixels, said column buffer comprising:
      a plurality of column amplifiers, each of said columns of pixels associated with a corresponding one of said column amplifiers; and
      a plurality of line drivers, each of said line drivers connected between the output of at least one of said column amplifiers and a bus line to transmit signals from said column amplifier onto said bus line, each of said line drivers configured in a negative feedback loop and having a bus switch arranged within said feedback loop such that the settling time of said line driver is less than the settling time of a similar line driver having a bus switch outside a feedback loop; and
   a control circuit connected to manage the operation of said column buffer.

2. The imaging system of claim 1, further comprising an output device connected to receive said output signal and to store or display data related to said output signal.

3. The imaging system of claim 1, each of said line drivers comprising:
   a signal amplifier connected to receive signals from said pixels and transmit said signals to said bus line;
   a presettle circuit connected to said signal amplifier output; and
   an offset cancellation circuit connected to said signal amplifier output.

4. The imaging system of claim 1, comprising multiple bus lines, each of said bus lines connected to a group of said plurality of line drivers.

5. The imaging system of claim 4, further comprising a multiplexer connected to receive signals from said multiple bus lines and serialize said signals into a single signal.

6. The imaging system of claim 1, said column buffer further comprising a multiplexer connecting a plurality of said column amplifiers to one of said line drivers.

7. The imaging system of claim 1, wherein said column amplifiers provide gain to said pixel signals, and wherein said line drivers have substantially unity gain.

8. The imaging system of claim 1, further comprising a video amplifier connected to receive signals from said bus line and produce an analog output signal.

9. An imaging system, comprising:
   an array of pixels, said array connected to transduce incident radiation into an electrical output signal;
   a first scanner connected to communicate with said groups of pixels according to a first spatial dimension;
   a second scanner connected to communicate with groups of said pixels according to a second spatial dimension;
   a pixel buffer connected to process and temporarily store signals from said array of pixels, said pixel buffer comprising:
      a plurality of pixel amplifiers, each of said groups of pixels according to said first spatial dimension associated with a corresponding one of said pixel amplifiers; and
      a plurality of line drivers, each of said line drivers connected between the output of at least one of said pixel amplifiers and a bus line to transmit signals from said pixel amplifier onto said bus line, each of said line drivers configured in a negative feedback loop and having a bus switch arranged within said feedback loop such that the settling time of said line driver is less than the settling time of a similar line driver having a bus switch outside a feedback loop; and
   a control circuit connected to manage the operation of said pixel buffer.

10. The imaging system of claim 9, further comprising an output device connected to receive said output signal and to store or display data related to said output signal.

11. The imaging system of claim 9, each of said line drivers comprising:
   a signal amplifier connected to receive signals from said pixels and transmit said signals to said bus line;
   a presettle circuit connected to said signal amplifier output; and
   an offset cancellation circuit connected to said signal amplifier output.

12. The imaging system of claim 9, comprising multiple bus lines, each of said bus lines connected to a group of said plurality of line drivers.

13. The imaging system of claim 12, further comprising a multiplexer connected to receive signals from said multiple bus lines and serialize said signals into a single signal.

14. The imaging system of claim 9, said pixel buffer further comprising a multiplexer connecting a plurality of said pixel amplifiers to one of said line drivers.

15. The imaging system of claim 9, wherein said pixel amplifiers provide gain to said pixel signals, and wherein said line drivers have unity gain.

16. The imaging system of claim 9, wherein said array of pixels is rectangular having rows and columns, said first spatial dimension comprising a position along one of said rows, said second spatial dimension comprising a position along one of said columns of pixels.

17. The imaging system of claim 9, wherein said array of pixels is circular having concentric rings of pixels around a center point and an axis dividing said array into two equal halves, said first spatial dimension comprising a first polar coordinate, said second spatial dimension comprising a second polar coordinate.

* * * * *